United States Patent
Guenther (12)

(10) Patent No.: US 6,735,554 B2
(45) Date of Patent: May 11, 2004

(54) METHOD AND APPARATUS FOR REPRESENTING COMPLEX VECTOR DATA

(75) Inventor: Mark L. Guenther, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 83 days.

(21) Appl. No.: 10/150,588

(22) Filed: May 16, 2002

(65) Prior Publication Data

US 2003/0216892 A1 Nov. 20, 2003

(51) Int. Cl.[7] .............................................. G06F 17/00
(52) U.S. Cl. ...................................... 702/189; 702/180
(58) Field of Search ........................... 702/189, 66–71, 702/73–76, 79, 124, 126, 176, 178, 179, 180, 187, FOR 103, FOR 104, FOR 107, FOR 108, FOR 110, FOR 131, FOR 134, FOR 139, FOR 154, FOR 170; 345/961; 324/76-12, 76.19, 76.22; 708/809; 375/232, 235, 279, 308, 329, 320, 323, 326, 298, 300, 327; 342/188, 194, 195

(56) References Cited

U.S. PATENT DOCUMENTS

| 5,598,439 A | * | 1/1997 | Wagner ....................... 375/326 |
| 5,930,299 A | * | 7/1999 | Vannatta et al. ............. 375/269 |
| 6,334,203 B1 | * | 12/2001 | Inagawa ....................... 714/798 |

* cited by examiner

*Primary Examiner*—Hal Wachsman
(74) *Attorney, Agent, or Firm*—Moser, Patterson, Sheridan LLP; Francis I. Gray

(57) ABSTRACT

A method for representing a modulated signal vector by determining complex coordinates for the signal vector where the complex coordinates define respective locations on a complex plane that is logically segmented into a plurality of regions, and by generating, for each logical region, a respective signal density indicative magnitude value to form a histogram of the logical regions and their respective magnitude values.

17 Claims, 5 Drawing Sheets

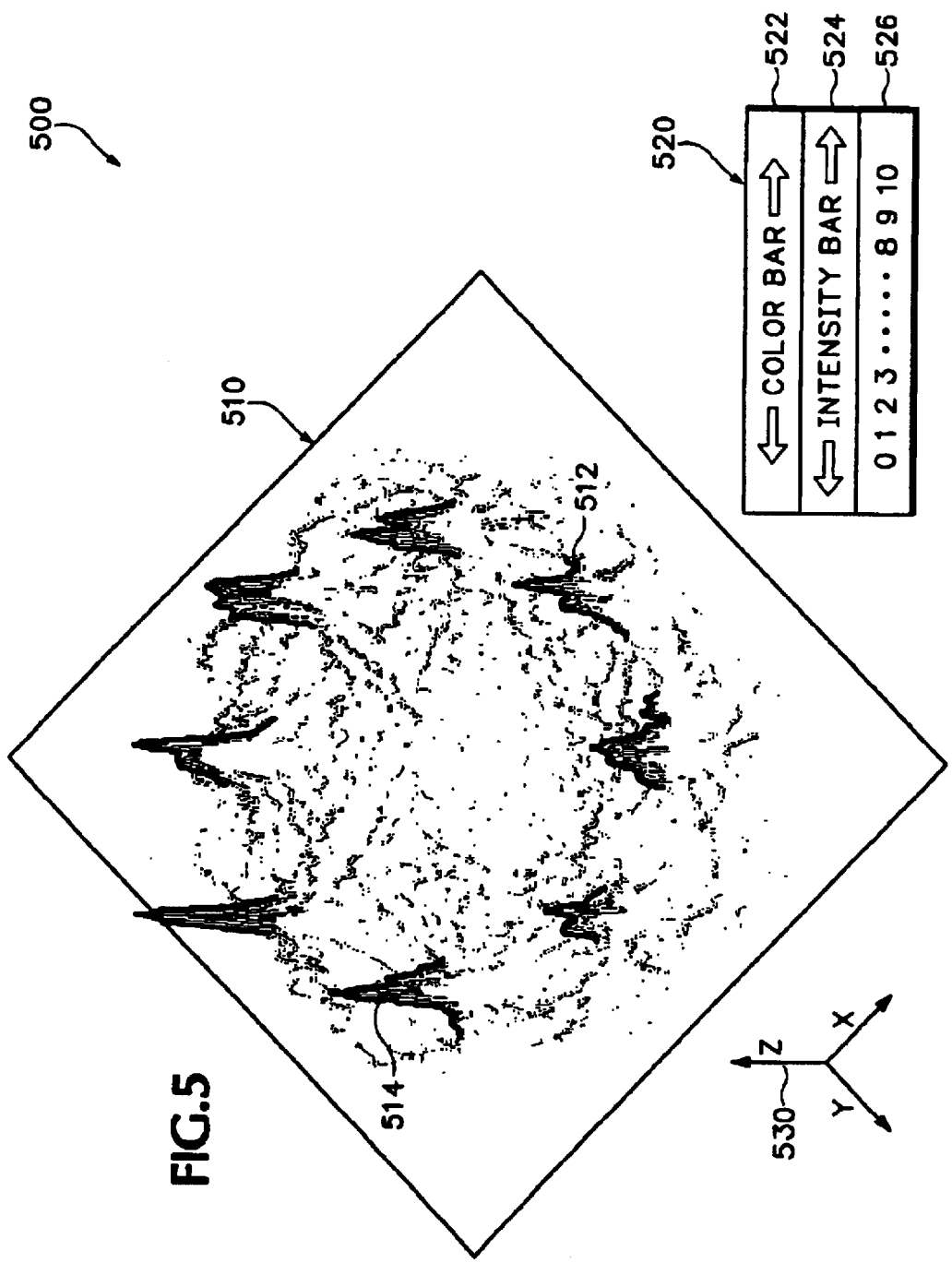

US 6,735,554 B2

METHOD AND APPARATUS FOR REPRESENTING COMPLEX VECTOR DATA

TECHNICAL FIELD

The invention relates generally to signal analysis devices and, more specifically, to a method and apparatus for representing complex vector data.

BACKGROUND OF THE INVENTION

A common practice in the field of communication system measurement is to display a time-varying complex signal vector by plotting the real component versus the imaginary component on a Cartesian coordinate system. Such a display is frequently referred to as a polar display, independent of whether Cartesian or polar axes are used. For example, using a representative complex signal $S(t)=I(t)+j*Q(t)$, the values $I(t)$ and $Q(t)$ are both plotted parametrically against time. FIGS. 1A and 1B show some typical polar displays. FIG. 1A shows a polar display that is of short enough duration that the vector trajectory can be followed. FIG. 1B shows a longer vector record, in which the gross features and trends can be discerned but the path of the vector cannot be followed due to the number of overlapping lines displayed.

SUMMARY OF THE INVENTION

These and other deficiencies of the prior art are addressed by the present invention of a method and apparatus for representing complex vector signals or data. The invention advantageously allows very long records (i.e., vector data accumulated over a relatively long time period) to be viewed in a manner conveying to the viewer useful information regarding the signal density of the vector signal in various regions of a polar plane.

A method according to an embodiment of the invention for representing a modulated signal vector comprises determining complex coordinates for the signal vector where the complex coordinates define respective locations on a complex plane that is logically segmented into a plurality of regions, and by generating, for each logical region, a respective signal density indicative magnitude value to form a histogram of the logical regions and their respective magnitude values.

BRIEF DESCRIPTION OF THE DRAWINGS

The teachings of the present invention can be readily understood by considering the following detailed description in conjunction with the accompanying drawings, in which:

FIG. 5 depicts a graphical representation of a three-dimensional projection useful in understanding the present invention.

To facilitate understanding, identical reference numerals have been used, where possible, to designate identical elements that are common to the figures.

DETAILED DESCRIPTION OF THE INVENTION

The subject invention will be primarily described within the context of a measurement apparatus such as a digital storage oscilloscope (DSO) that receives a signal under test (SUT) that may be modeled as a complex vector that varies with time. The SUT, illustratively a communications signal having in-phase and quadrature components, is processed to derive a corresponding histogram representation which may be displayed using a two or three-dimensional projection. However, it will be appreciated by those skilled in the art that the invention may be advantageously employed in any signal measurement, analysis or display device in which time varying vector signal processing is employed.

Figure 1A:
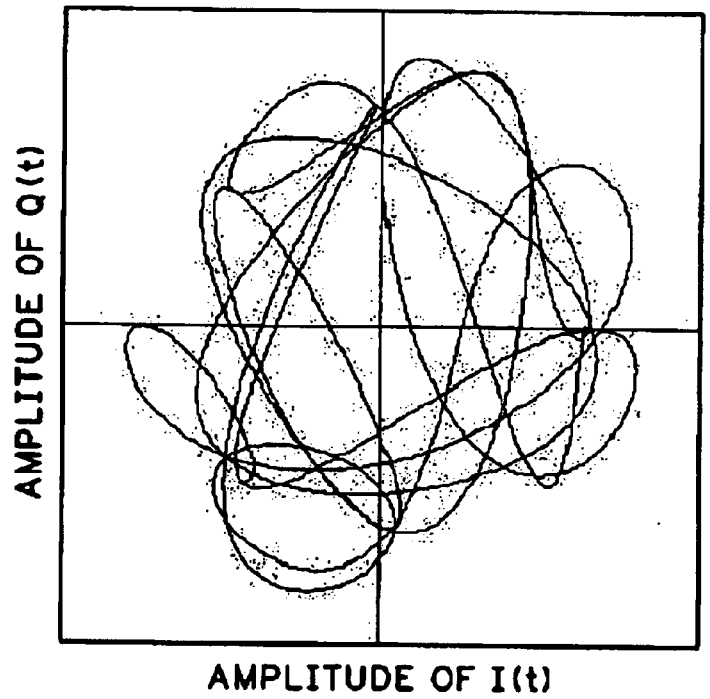
FIGS. 1A and 1B graphically depict prior art polar display representations of a complex vector signal.
Figure 1B:
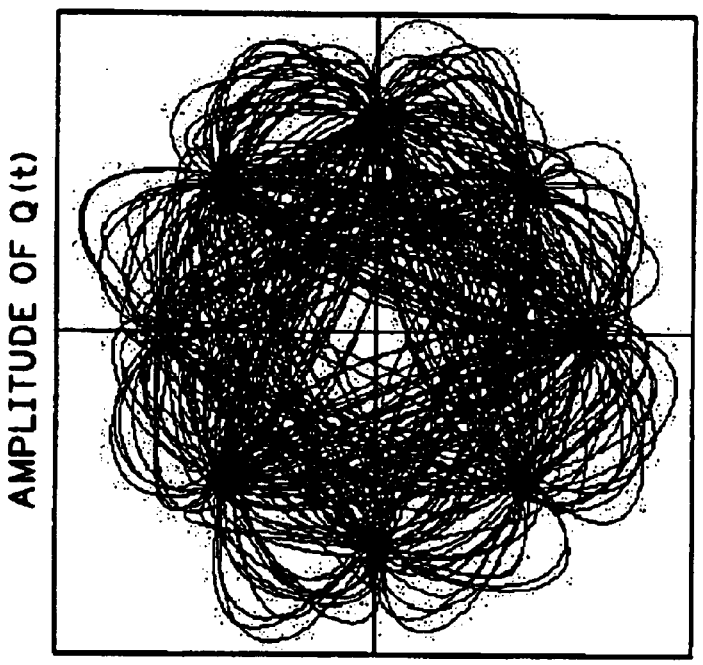
Figure 2:
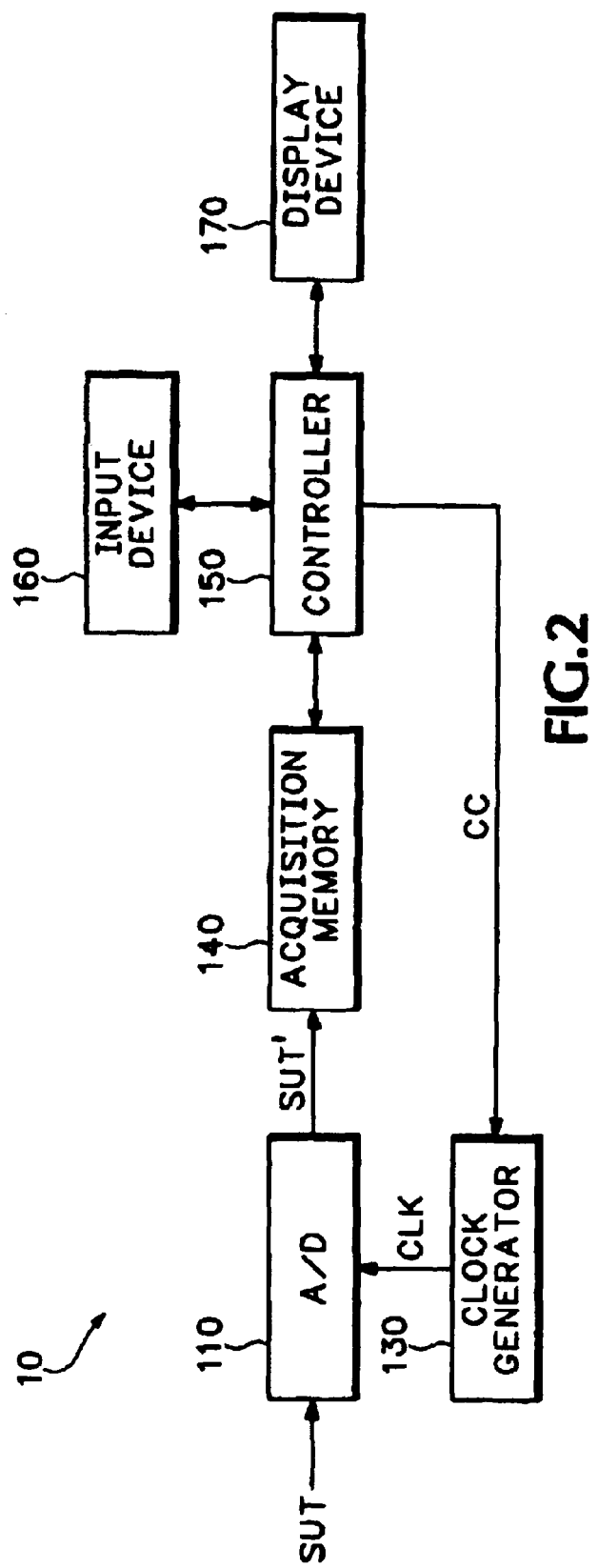
FIG. 2 depicts a high-level block diagram of a signal analysis system.

FIG. 2 depicts a high-level block diagram of a signal analysis device. Specifically, the signal analysis device 10 of FIG. 2 is capable of receiving input signals from a plurality of input probes (not shown), where each probe provides a signal under test (SUT) that is coupled to a respective analog to digital (A/D) converter. The SUT comprises, illustratively, a quadrature amplitude modulation (QAM), phase shift keyed (PSK) or other complex vector signal utilizing, for example, a carrier signal having modulated thereon in-phase and quadrature phase components. The output of the A/D converter is subjected to further processing substantially in accordance with the processing discussed below.

The signal analysis device 10 of FIG. 2 comprises an analog to digital (A/D) converter 110, a clock source 130, a memory 140, a controller 150, an input device 160, a display device 170 and an interface device 180.

The A/D converter 110 receives and digitizes a signal under test (SUT) in response to a clock signal CLK produced by the clock source 130. The clock signal CLK is preferably a clock signal adapted to cause the A/D converter 110 to operate at a maximum sampling rate, though other sampling rates may be selected. The clock signal 130 is optionally responsive to a clock control signal CC produced by the controller 150 to change frequency and/or pulse width parameters associated with the clock signal CLK.

An output signals SUT' produced by the A/D converter 110 is stored in the acquisition memory 140. The acquisition memory 140 cooperates with the controller 150 to store data samples provided by the A/D converter 110 in a controlled manner such that samples from a desired A/D converter may be provided to the controller 150 for further processing and/or analysis.

The controller 150 is used to manage the various operations of the signal analysis device 10. The controller 150 performs various processing and analysis operations on the data samples stored within the acquisition memory 140. The controller 150 receives user commands via an input device 160, illustratively a keypad or pointing device. An embodiment of the controller 150 will be described in more detail below with respect to FIG. 3.

The signal analysis device 10 of FIG. 2 is depicted as receiving only one signal under test (SUT). However, it will be appreciated by those skilled in the art that many signals under test may be received and processed by the signal analysis device 10. Each signal under test is preferably processed using a respective A/D converter 110, which A/D converter may be clocked using the clock signal CLK provided by clock source 130 or by another clock source.

Figure 3:
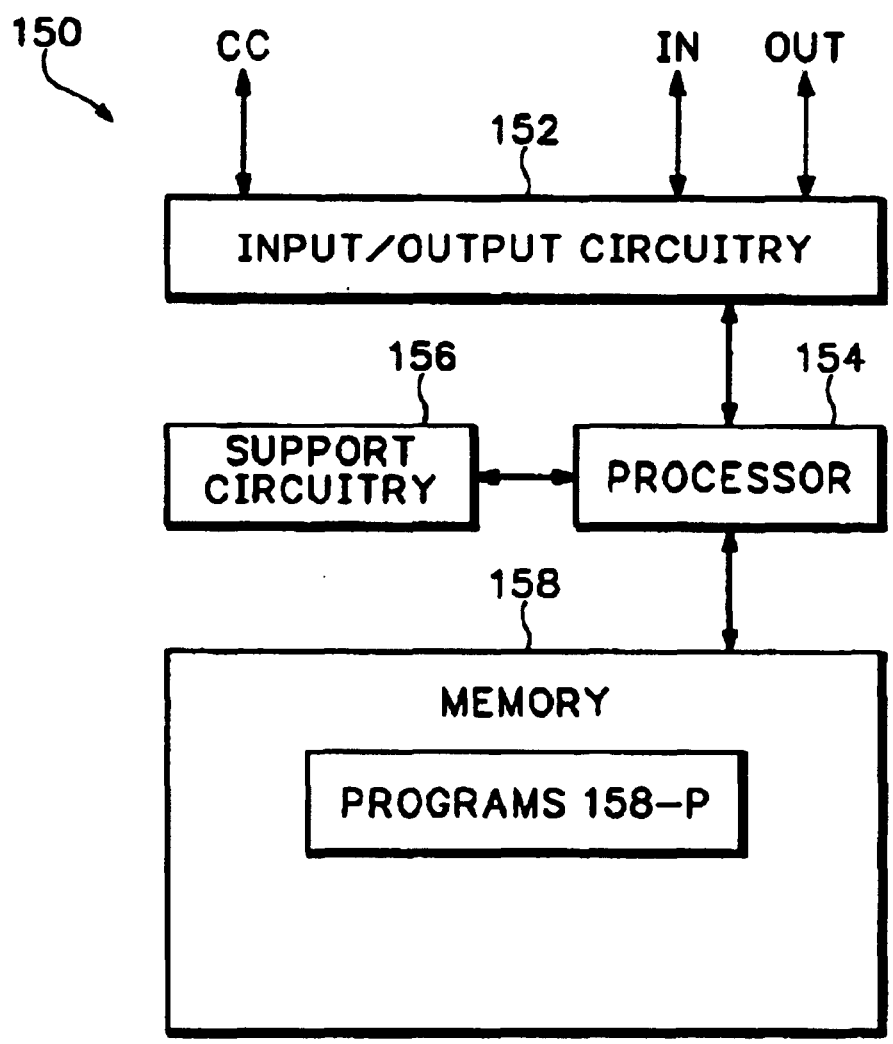
FIG. 3 depicts a high-level block diagram of a controller suitable for use in the signal analysis system of FIG. 1.

FIG. 3 depicts a high-level block diagram of a controller suitable for use in the signal analysis device 10 of FIG. 2. Specifically, the controller 150 of FIG. 2 comprises a processor 154 as well as memory 158 for storing various control programs 158-P. The processor 154 cooperates with conventional support circuitry 156 such as power supplies, clock circuits, cache memory and the like as well as circuits that assist in executing the software routines stored in the memory 158. As such, it is contemplated that some of the process steps discussed herein as software processes may be implemented within hardware, for example as circuitry that cooperates with the processor 154 to perform various steps. The controller 150 also contains input/output (I/O) circuitry 152 that forms an interface between the various functional elements communicating with the controller 150. For example, in the embodiment of FIG. 2, the controller 150 optionally communicates with the clock source 130 (via clock control signal CC) and the decimator 120 (via decimator control signal DC). The controller 150 also communicates with the input device 160 via a signal path IN, a display device 170 via a signal path OUT and the interface device 180 via a signal path INT and the acquisition memory 140 via signal path MB. The controller 150 may also communicate with additional functional elements (not shown). It is noted that the memory 158 of the controller 150 may be included within the acquisition memory 140, or that the acquisition memory 140 may be included within the memory 158 of the controller 150.

Although the controller 150 of FIG. 3 is depicted as a general-purpose computer that is programmed to perform various control functions in accordance with the present invention, the invention can be implemented in hardware as, for example, an application specific integrated circuit (ASIC). As such, the process steps described herein are intended to be broadly interpreted as being equivalently performed by software, hardware or a combination thereof.

Figure 4:
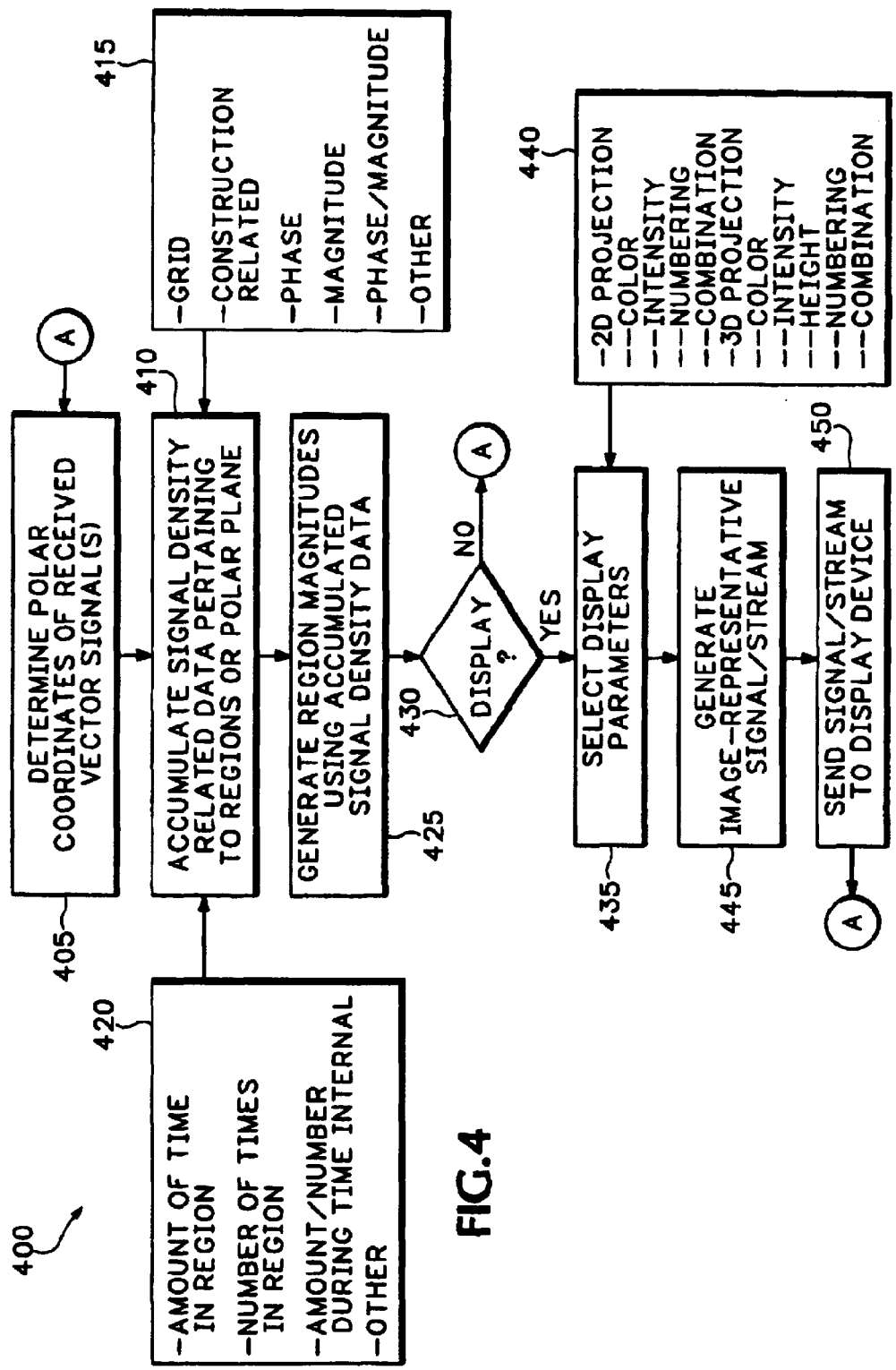
FIG. 4 depicts a flow diagram of a method according to an embodiment of the invention.

FIG. 4 depicts a flow diagram of a method according to an embodiment of the invention. Specifically, FIG. 4 depicts a flow diagram of a method 400 for processing complex vector signals to provide a signal density indicative representation which may be displayed or further processed. The method 400 of FIG. 4 may be implemented by the signal analysis system 10 of FIG. 2.

At step 405, complex coordinates associated with a received complex vector signal(s) are determined, using samples stored in the acquisition memory 140. This determination may be based on samples provided by a single A/D converter, representing a narrowband complex signal vector modulated with a carrier frequency. This determination may also be made based on samples from two A/D converters, representing the in-phase and quadrature phases of a complex signal vector. Those skilled in the art will recognize that the steps of carrier recovery, down-conversion, filtering, timing recovery, and interpolation will be employed as required in the determination of the samples.

At step 410, signal density related data pertaining to regions of a polar plane is accumulated. That is, a polar plane upon which complex vector signals may be plotted is logically divided into a plurality of regions, where each of the regions has associated with it signal density related data, where the respective signal density related data is accumulated over a period of time.

Referring to box 415, a polar plane may be logically divided into a plurality of regions according to a grid pattern, according to a constellation-related pattern (e.g., a QAM 64, a QAM 256 or other constellation-related pattern), according to phase and/or magnitude information associated with the received complex vector signal(s) or according to other geometric or data-related criteria.

Referring to box 420, signal density related data for a region comprises an amount of time that the region is associated with the complex vector signal, a number of times the complex vector signal traverses or otherwise translates into a polar coordinate within a region, or any combination thereof during a predefined time interval or total time interval. Other signal density related data may also be utilized.

At step 425, a magnitude value is generated for each region using accumulated signal density data. That is, for each region a respective magnitude value is generated using signal density related data accumulated over a predetermined interval or a total interval, wherein the signal density data may comprise one or more of the factors described above with respect to box 420. Step 425 operates to produce a series of histograms, where each region has associated with it a respective magnitude value. The collection of values is useful in representing complex vector signal density within each region, such that comparative or relative signal densities between regions may be further processed and/or visualized.

Within the context of the present disclosure, a histogram refers to a one- or two-dimensional array of magnitude values. That is, each bin (or region, or cell) has a single value associated with it such as a magnitude value. A one-dimensional histogram is usually displayed as a bar chart, with the bins running across the horizontal axis and the value for each bin displayed on the vertical axis. As the number of bins becomes large, the "bars" become narrow such that the top of the bar chart starts to look like a smooth curve. A two-dimensional histogram is usually displayed as a two-dimensional bar chart. Again, as the number of bins becomes large, the result looks like a relatively smooth surface if displayed as a three dimensional projection. As will be discussed below, there is only one value (e.g., magnitude) associated with each of a plurality of regions, and the collection of regions (together with the values) comprises a histogram. In alternate embodiments, multiple values may be associated with each region.

At step 430, a query is made as to whether the data processed thus far is to be displayed. If the query at step 430 is answered negatively, then the method 400 returns to step 405 to determine the polar coordinates of additional complex vector signal(s). If the query at step 430 is answered affirmatively, then at step 435 display parameters are selected. Referring to box 440, the display parameters generally involve the selection of a two-dimensional (2D) projection or three-dimensional (3D) projection. In the case of a 2D projection, display parameters such as color, intensity, numeric value or a combination thereof are selected. In the case of a 3D projection, parameters such as color, intensity, height, numeric value or a combination thereof are selected.

Each of the selected display parameters is used to distinguish signal density differences between regions. For example, in the case of a color parameter, a color spectrum is divided from low signal density (e.g., yellow tones) to high signal density (e.g., red tones). In the case of an intensity (or brightness) parameter, a gray scale is divided from low signal density (e.g., near black levels) to high signal density (e.g., near white levels). Numeric parameters may be used (e.g., scale of 0–10, 1–10, percentage or the like) to indicate signal density or to enable visual comparisons between regions. Additionally, with respect to the 3D projection, a height parameter may be utilized to visually indicate in a third dimension the relative signal density of a particular region. It is noted that any of the color, intensity, numeric and height parameters may be used in combination, and that a key or legend relating the various parameters used may also be displayed.

At step 445 an image-representative signal or stream is generated using the display parameter selected at step 435 and the histogram data associated with the various regions. Optionally, a key or legend depicting the relationship between the various parameters (color, intensity, height and numeric) is also included within the generated image-representative signal or stream. At step 450, the image-representative signal/stream is propagated to a display device (e.g., display device 170) for subsequent display.

FIG. 5 depicts a graphical representation of a three-dimensional projection useful in understanding the present invention. Specifically, the imagery 500 of FIG. 5 represents imagery produced in one embodiment of the invention in which the complex plane is represented as a plurality of cells arranged as a grid or array, the histograms associated with each cell are displayed as a three-dimensional projection including a height parameter and an intensity parameter and, optionally, a color parameter. In FIG. 5, the depicted signal comprises, illustratively, an 8 PSK signal.

Specifically, the imagery 500 of FIG. 5 comprises a three-dimensional projection 510 of histogram data, a parameter legend 520 and a coordinate legend 530. The three dimensional projection 510 depicts the relative signal intensity levels of each of a plurality of cells within a grid arrangement used to logically divide a polar plane into a plurality of regions. It is noted that the constellation of the complex vector signal used to provide the raw data has increased signal intensity over time in eight distinct regions of the polar plane.

Referring to the three dimensional projection 510 of FIG. 5, a first of the eight constellation points 512 is seen as having a reduced height and a reduced intensity level as compared with a second constellation point 514. The reduced height and reduced intensity level are both indicators of reduced signal intensity within the first constellation region 512 in comparison to the second constellation 514. While depicted as a gray-scale image in FIG. 5, it will be appreciated by those skilled in the art that the three-dimensional projection 510 may also include color imagery representative of signal intensity levels. Thus, for example, the first constellation 512 may have a first color (e.g., yellow) associated with those cells exhibiting the greatest signal intensity for the first constellation point 512, while the second constellation point 514 may have a second color (e.g., red) associated with those cells exhibiting the greatest signal intensity levels for the second constellation point 514.

FIG. 5 also depicts a parameter legend or key 520 in which a color bar 522, an intensity bar 524, and a numeric representation 526 are equated in relative terms. The color bar 522 provides a plurality of colors from, illustratively, a low intensity representative color on the left to a high intensity representative color on the right, with intermediate colors representing increasing signal densities from left to right. Similarly, the intensity bar 524 provides a corresponding gray scale representation of signal intensity progressing from a low (dark) intensity on the left indicating low signal density towards a high (light) intensity on the right indicating a high signal density. The numeric representation 526 indicates, illustratively, a percentage signal intensity ranging from zero for low intensity on the left toward ten or high intensity on the right.

It will be appreciated by those skilled in the art that the three-dimensional projection 510 of FIG. 5 may be modified to produce a two-dimensional projection by, for example, manipulating the viewing angle such that a top or plan view of the data is provided (i.e., the Z or height parameter approaches zero).

The imagery discussed above with respect to FIG. 5 may be captured and displayed on a measurement device such as a digital storage oscilloscope (DSO). Advantageously, the imagery 510 (and two dimensional or other derivatives of such imagery) provides rapid assessment of complex signal density within regions of interest, such as the eight constellation points depicted. It will be appreciated that more or fewer cells or regions may be used to divide the complex plane, depending upon the type of modulation employed to produce the signal under test processed according to the teachings of the present invention. For example, if the modulation type is very complex, a higher number of "pixels" (or cells or regions) may be used to build the histogram such that a higher "resolution" view of the SUT may be provided. Further, the inventors contemplate that the subject invention may be adapted to many different modulation techniques and many different parameter combinations, including those discussed above with respect to box 440 of FIG. 4. Moreover, a user input may be received that selects one or more cells or regions such that numeric (or other) parameters of the selected cell(s) or region(s) are also displayed.

The subject invention provides several advantages over previous methods. For example, useful information about a waveform can be discerned in areas where a conventional polar display is opaque due to the number of overlaid lines. Thus, as noted above with respect to FIGS. 4 and 5, a histogram representation of data associated with each of a plurality of regions clearly indicates signal densities that vary from region to region and, more particularly, signal densities that vary from constellation point to constellation point. In this manner, very long waveforms may be displayed. In fact, using the invention, a waveform of any duration could be displayed in a manner providing useful information.

In one embodiment of the invention, a record of a signal represented by the complex vector S(t) is stored in digital form (i.e. quantized in time and amplitude) in the acquisition memory 140 or controller memory 158 of a host system comprising measurement device, digital computer or signal processing system. Specifically, let $S^i(k)$ and $S^q(k)$ represent the $k^{th}$ in-phase and quadrature samples, respectively, of the complex signal (where k runs from 1 to L):

$$S^i(k)=\text{real}\{S(k*\Delta t)\},\ 1 \leq k \leq L \quad \text{(eq. 1)}$$

$$S^q(k)=\text{imag}\{S(k*\Delta t)\},\ 1 \leq k \leq L \quad \text{(eq. 2)}$$

In this embodiment, the following procedure is used to generate the desired display:

(Step 1) Select the number of grid cells over which a histogram is to be calculated to be in the form of a rectangular array having a horizontal dimension M and a vertical dimension N, such that a total of M*N cells are defined.

(Step 2) Reserve and initialize to zero a memory block P of M*N elements, in which to store the values corresponding to the cells. Although this memory may be accessed using a linear addressing approach in the host system, it can be modeled as if it were addressed using two indexes, so that P(i,j) is equivalent to a linear addressing of P(N*i+j).

(Step 3) Compute $R^i$, the range of values represented by the real (inphase) component of S, using equation 3 as follows:

$$R^i = S^i_{max} - S^i_{min} \quad \text{(eq. 3)}$$

where:

$S^i_{max}$ is the maximum value of $S^i(k)$ over $1 \leq k \leq L$; and
$S^i_{min}$ is the minimum value of $S^i(k)$ over $1 \leq k \leq L$.

(Step 4) Compute $R^q$, the range of values spanned by the imaginary (quadrature) component of S in the manner described above with respect to equation 3.

(Step 5) For each element in $S^i(k)$, compute a corresponding index $i(k)$ that represents an index into the horizontal dimension of the cell array, so that $1 \leq i(k) \leq M$ for all k, using equation 4 as follows:

$$i(k) = \text{floor}\left([S^i(k) - S^i_{\min}] * \frac{M}{R^i}\right) + 1 \quad \text{(eq. 4)}$$

where the floor function returns the largest integer less than or equal to its argument.

(Step 6) In the manner described above with respect to equation 4, compute for each element in $S^j(k)$ a corresponding index $j(k)$ that represents an index into the vertical dimension of the cell array, so that $1 \leq j(k) \leq N$ for all k.

(Step 7) Accumulate the histogram values that correspond to the individual cells according to the following pseudocode:
for k=1 to L $$P(i(k),j(k))=P(i(k),j(k))+1 \quad \text{(eq. 5)}$$

end for (Step 8) Create a mapping between the range of values contained in the array P and an appropriate set of values or parameters representing the range of gray scale intensities or color hues to be used for displaying a two-dimensional image or projection. For three dimensional images or projections, a height parameter may also be used as previously discussed. As an example for a gray scale image, the values representing gray scale intensities might be in the range from 0 to 1. Then the display matrix D would be created from the matrix P according to equation 6, as follows:

$$D(i,j) = \frac{P(i,j)}{P_{\max}} \quad \text{(eq. 6)}$$

where $P_{max}$ is the maximum value of P over all i and j.

Although various embodiments which incorporate the teachings of the present invention have been shown and described in detail herein, those skilled in the art can readily devise many other varied embodiments that still incorporate these teachings.

It is claimed:

1. A method for representing a modulated signal vector, comprising:
   determining complex coordinates for said modulated signal vector, said complex coordinates defining respective locations on a complex plane, said complex plane being logically segmented into a plurality of regions; and
   generating, for each logical region, a respective signal density indicative magnitude value to form a histogram of said logical regions and said respective signal density indicative magnitude values.

2. The method of claim 1, wherein said signal density indicative magnitude value of each logical region is determined according to an amount of time during a predefined time interval that said modulated signal vector complex coordinates were within said logical region.

3. The method of claim 1, wherein said signal density indicative magnitude value of each logical region is determined according to a number of times during a predefined time interval that said signal vector complex coordinates were within said logical region.

4. The method of claim 1, further comprising:
   displaying said histogram associated with said logical regions using a two dimensional projection.

5. The method of claim 4, wherein each of said displayed histograms comprises a color parameter indicative of a relative signal density.

6. The method of claim 5, further comprising:
   displaying imagery providing a visual correlation between histogram color and a corresponding numerical representation of signal density.

7. The method of claim 4, wherein each of said displayed histograms comprises an intensity parameter indicative of a relative signal density.

8. The method of claim 7, further comprising:
   displaying imagery providing a visual correlation between histogram intensity and a corresponding numerical representation of signal density.

9. The method of claim 8, wherein a number of cells in an array of cells is selected according to at least one of a memory constraint and a computational constraint.

10. The method of claim 1, further comprising:
    displaying said histograms associated with said logical regions using a three dimensional projection, wherein each of said displayed histograms includes a height parameter indicative of a relative signal density.

11. The method of claim 10, further comprising:
    displaying imagery providing a visual correlation between said histogram height and a corresponding numerical representation of signal density.

12. The method of claim 10, wherein each of said displayed histograms comprises a color parameter indicative of a relative signal density and an intensity parameter indicative of a relative signal density.

13. The method of claim 12, further comprising:
    displaying imagery providing a visual correlation between displayed histogram color, displayed histogram intensity and a corresponding numerical representation of signal density.

14. The method of claim 1, wherein each of said plurality of regions comprises a cell within an array of cells logically segmenting a polar plane.

15. The method of claim 14, wherein a number of cells in said array of cells is selected according to a desired display resolution.

16. Apparatus for representing a modulated signal vector, comprising:
    means for determining complex coordinates for said modulated signal vector, said complex coordinates defining respective locations on a complex plane, said complex plane being logically segmented into a plurality of regions; and
    means for generating, for each logical region, a respective signal density indicative magnitude value to form a histogram of said logical regions and said respective signal density indicative magnitude values.

17. A computer readable medium having stored thereon software instructions that, when executed by a processor, perform the steps of:
    determining complex coordinates for a modulated signal vector, said complex coordinates defining respective locations on a complex plane, said complex plane being logically segmented into a plurality of regions; and
    generating, for each logical region, a respective signal density indicative magnitude value to form a histogram of said logical regions and said respective signal density indicative magnitude values.

* * * * *